United States Patent [19]

Nillsson

[11] Patent Number: 5,566,197
[45] Date of Patent: Oct. 15, 1996

[54] TUNABLE GAIN COUPLED LASER DEVICE

[75] Inventor: Olle Nillsson, Fjäråas, Sweden

[73] Assignee: Telefonaktiebolaget LM Ericsson, Stockholm, Sweden

[21] Appl. No.: 298,977

[22] Filed: Sep. 2, 1994

[30] Foreign Application Priority Data

Sep. 2, 1993 [SE] Sweden .................................. 9302830

[51] Int. Cl.$^6$ ......................................................... H01S 3/10
[52] U.S. Cl. ................................................ 372/20; 372/70
[58] Field of Search .................................. 372/69, 70, 20

[56] References Cited

U.S. PATENT DOCUMENTS

| | | | |
|---|---|---|---|
| 4,641,312 | 2/1987 | Schäfer et al. ........................... | 372/25 |
| 4,803,688 | 2/1989 | Lawandy ................................. | 372/21 |
| 5,103,456 | 4/1992 | Scifres et al. ........................... | 372/50 |

FOREIGN PATENT DOCUMENTS

| | | |
|---|---|---|
| 2501422 | 7/1975 | Germany. |
| 3019193 | 11/1989 | Germany. |

OTHER PUBLICATIONS

K. Petermann, "Laser Diode Modulation And Noise" Kluwer Academic Publisher, pp. 5–10, No. date.
Peter S. Zory, Jr. "Quantum Well Lasers", Academic Press, Inc. pp. 461–479, No date.
I. Maximov et al., "Fabrication of Quantum Dot Structures Using Aerosol Deposition and Plasma Etching Techniques," J. Vac. Sci. Technol., 11(4), pp. 748–753 (Jul./Aug. 1993).
L. Samuelson et al., "Studies of GaInAs/InP Quantum Dots Processed From Aerosol Deposited Particles," 6th Int'l Conf. on InP and Related Materials, Santa Barbara, pp. 379–382 (1994) No month.
L. Samuelson et al., "Aerosol Technology Based Fabrication of Nanometer–Sized Structures for Physics, Optics and Electronics Applications," Dept. of Solid State Physics, Lund University No Date.
F. P. Schäfer, *Dye Lasers*, pp. 79–83, Springer–Verlag: New York (1973) No month.

*Primary Examiner*—James W. Davie
*Attorney, Agent, or Firm*—Burns, Doane, Swecker & Mathis, L.L.P.

[57] ABSTRACT

A tunable gain coupled laser device, preferably a so called DFB-laser, includes a laser waveguide with an active material, a pump laser which emits pump light with a pumplight wavelength $\lambda_p$ and a device for orientation and direction of pumplight beams towards the waveguide. The active material in the laser waveguide is a semiconductor material and it is excited by two pumplight beams which originate from one and the same pump laser and which are directed against each other, each forming and angle of incidence with the laser waveguide.

24 Claims, 3 Drawing Sheets

TUNABLE GAIN COUPLED LASER DEVICE

BACKGROUND

The present invention relates to a tunable gain coupled laser device with a laser waveguide with active material and a pumplaser which emits pumplight. The pumplight beams are oriented and directed towards the laser waveguide.

In gain guided (gain coupled) DFB-lasers (Distributed Feedback Laser) the laser frequency is given by the distance between two adjacent regions with a high gain of the material having to be half a wavelength in the waveguide. Up to now it has been difficult to make such devices tunable to specific frequencies within the gain region. One way is then to form a "grating" or similar with a period which can be varied, but such gratings are very difficult to realize, design etc. The advantages with obtaining a tunable gain coupled e.g. DFB-laser are considerable. It is well known that DFB-lasers generally are dynamically longitudinally mono-moded (single mode or mono-mode). Particularly gain coupled DFB-lasers are particularly mode-stable. It is also well known that optically pumped lasers have certain advantages such as for example that there are no requirements that the laser medium must have particular electrical properties, the laser resonator is not disturbed by electrical contacts and so on. The use of a laser as a pumplight source gives a good concentration of the pumping power but it is also quite complicated. In known arrangements it has furthermore been necessary to provide fixed reflection devices in the laser waveguide. In known tests, in pumping of lasers a standing wave pattern has unintentionally been created, i.e. a grating has been induced. The induced grating however did not correspond to the one that was intended with the laser resonator and in order to remove the grating, optical isolators have been introduced. In "Dye Lasers", 1973, pp. 78–82, F.P. Schäfer an optically pumped DFB dye laser is described. This however merely relates to dye lasers which is very different from e.g. a semiconductor. It is thus not merely a matter of just changing active material. If e.g. a semiconductor is used as an active material, charge carrier diffusion must be prevented. Furthermore with the device in "Dye Lasers" reflection into the pumplaser will be caused and the device is not as compact as could be wanted.

SUMMARY

It is an object with the present invention to provide a tunable gain coupled laser device, preferably a DFB-laser such as initially referred to which can be tuned to a specific frequency within the gain region. It is furthermore an object with invention to combine the advantages of particularly a DFB-laser which as mentioned above are dynamically longitudinally mono-moded and very mode stable, with the advantages of optical pumping with no requirements as to the electrical properties of the laser medium and wherein the laser resonator is not disturbed by electrical contacts etc. It is furthermore an object with the invention to provide a device with a great tunability obtained through two mechanisms which as such are independant. It is furthermore an object with the invention that the device does not require any fixed reflection arrangement in the laser waveguide and that is completely free of reflections in an unpumped condition. Another object with the invention is to provide good pulse properties. It is furthermore an object with the invention to provide a device which is compact and easy to fabricate, flexible and easy to use.

A particular object with the invention is to provide semiconductor tunable gain coupled laser device fulfilling the above-mentioned requirements. Particularly it is an object with the invention to provide a device wherein charge carrier diffusion is prevented. It is also an object of the invention to provide a device with a large gain band width and wherein the variations in refractive index are smaller than in most known devices. Generally it is an object to provide a device with very good optical gain properties which e.g. are better than when particularly a bulk material is used. One better particular embodiment is to efficiently use the pumplight. These as well as other objects are achieved through a device wherein the active material has an inverted population comprising naturally freely moving carriers such as in a semiconductor and wherein charge carrier diffusion is prevented. One particularly advantageous way to prevent so called charge carrier diffusion is to provide an active material comprising either quantum wires or quantum dots. They have very good optical gain properties but it is most difficult to pump them electrically. It has been found that with optical pumping some of those difficulties are overcome and an advantageous arrangement is obtained. The properties of and the fabrication of quantum dots or wires is further described in e.g. J.Vac. Sci. Technol All (1993) 748 by I. Maximov et al or L. Samuelson et al, "Studies of Gain As/InP quantum dots processed from aresol deposited articles, 6th Int. Conf. on InP and Related Mat., Santa Barbra USA, 1994.

The device can e.g. be made very compact if a grating is arranged substantially parallel with the laser waveguide reflecting the light emitted by a surface-emitting pumplaser arranged on the waveguide substrate. In order to provide beams crossing in the active layer of the waveguide, a reflecting device or a mirror is provided which can be controlled e.g. by a piezo device to give the desired angle of incidence of a beam.

According to one embodiment the device is so formed that the angles of incidence $\alpha_1$, $\alpha_2$ are different for the incident beams. According to an alternative embodiment the angle of incidence $\alpha_1$, $\alpha_2$ of the two pumplight beams are substantially but not identically equal. They can also differ. According to an advantageous embodiment the wavelength for which lasing occurs, the laser wavelength ($\lambda_L$) is given by $$\lambda_L = \frac{\lambda_P}{\cos\alpha}$$

Particularly the means for orienting and directing can be varied so that the laser wavelength $\lambda_L$ can be varied through variation of said means for orienting and directing. According to a particular embodiment the orienting means comprises a first and a second reflecting arrangement. More particularly the first and the second reflecting arrangements comprise rotatable and/or displaceable mirrors. According to this alternative embodiment the means for orienting and directing comprises a mirror arrangement which to some extent is rotatable. Particularly the pumping wavelength is variable or tunable so that laser wavelength can be varied through variation of the pump wavelength. According to different embodiments the pumplaser beam can be pulsed or continuous. According to an advantageous embodiment the pump laser beams are focused in the lateral direction.

BRIEF DESCRIPTION OF THE DRAWINGS

The invention will in the following be further described in an exemplifying and by no means limiting way under reference to the accompanying drawings, wherein.

DETAILED DESCRIPTION

Figure 1:
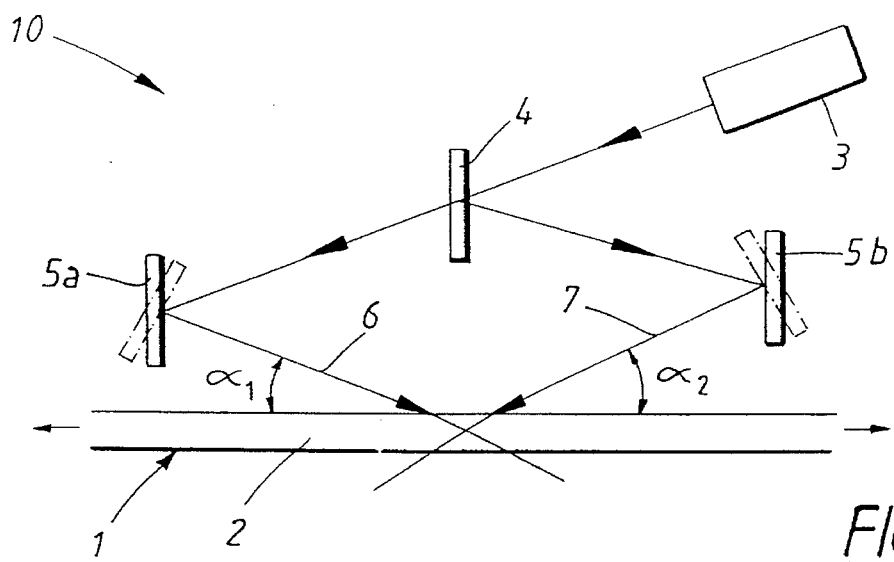
FIG. 1 illustrates a first embodiment of the device with two means for orienting and directing.

In FIG. 1 a first embodiment of invention is illustrated wherein a pumplaser 3, which can be tunable, emits a pumplight-beam which in a beam splitting device 4 is split up in two pumplight-beams which are incident to separate means 5a, 5b for orienting and directing which in the shown embodiment comprise rotatable and displaceable mirrors. The two pumplight beams 6, 7 then are substantially directed towards each other and are incident towards a laser waveguide 1 the active material 2 of which is more or less homogenously distributed wherein they are crossing. Advantageously a semiconductor material is used. However, therein charge-carrier diffusion has to be prevented. In an advantageous embodiment this is achieved through an active material comprising quantum wires or quantum dots. The pumplaser-beam from the pumplaser 3 may be pulsed but it can also be continuous. Requirements on the laser medium, the active material, is that it has to be pumped with laser light; thus it may not be such that it requires a broad-band light source. Still another requirement is that the carrier of the inversion energy within a laser medium must have a length of diffusion which is much smaller than half of the light wavelength. The angles of incidence $\alpha_1$, $\alpha_2$ of the oppositely directed pumplight beams can be of the same size but preferably they are somewhat different. They may also take different sizes. The relationship between the pumpwavelength, $\lambda_p$ and the laser wavelength $\lambda_L$ wherein the pumpwavelength is measured in the medium on top of the waveguide 1 (see FIG. 3) and the laser wavelength is the wavelength measured in the waveguide (see $\lambda_L$ of FIG. 3), is given by $$\lambda_L = \frac{\lambda_P}{\cos\alpha}$$

Thus $\lambda_L$ can be varied both through variation of the angle $\alpha$ as determined by $\alpha_1$ and $\alpha_2$ as well as by the pumpwavelength. In order to provide sufficently high pumping intensities, the pump laser beams are advantageously focused in the lateral direction.

Figure 2:
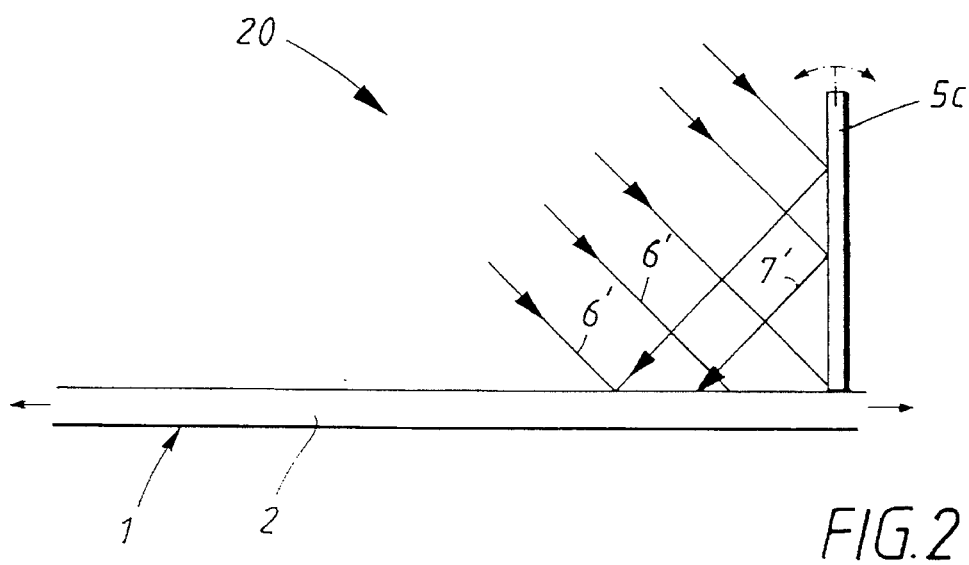
FIG. 2 illustrates a second embodiment of the invention with one common means for beam splitting, directioning and orienting.

Through the use of a thin active layer the angles $\alpha_1$ and $\alpha_2$ can be different which is not the case if a bulk material is used. In FIG. 2 an alternate embodiment of a device 20 is illustrated wherein the means for splitting, orienting and directing 5c of the pumplight beams are formed by mirror configurations with a somewhat rotatable mirror. Such configurations are known in that they have been used to burn in gratings along optical fibers. In this case there are no separate means for beam splitting but beam splitting as well as orienting and directing of the pumplight beams is provided through one and a same arrangement or means 5c.

As described above the invention provides a combination of the advantages with DFB-lasers which are gain coupled and optical pumping at the same time as a great tunability is obtained through two independent mechanisms, namely the angle of incidence $\alpha$ ($\alpha_1$, $\alpha_2$) and the pumpwavelength $\lambda_p$. Furthermore is not necessary to arrange fixed reflection arrangements in the laser waveguide, therefore this can be completely free from reflections in an unpumped condition. Since the pumping induces the gain as well as the feedback, the pulse properties will be different from known constructions.

The laser waveguide 1 has to be such that the pumplaser light efficiently can be focused thereinto and the laser medium in the waveguide has to be such that through optical pumping a high amplification per length unit can be obtained (for example 3–5dB over the pumped waveguide length). Furthermore, excited energy carriers like electrons are confined within individual quantum dots and/or quantum wires which are smaller than ⅒ of the laser wavelength parallel with the waveguide.

Figure 3:
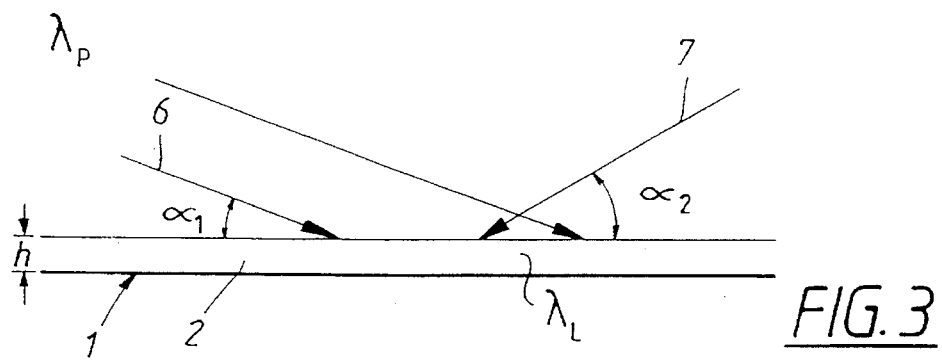
FIG. 3 illustrates the relationship between beam-propagation and wavelengths.

(In FIGS. 2 and 3 the pumplaser is not illustrated but merely the pumplight beams incident therefrom since its should be obvious how it can be arranged.)

FIG. 3 illustrates the relationship between the beam direction and wavelength. The lasing wavelength $\lambda_L$ is measured in the waveguide to which two pumplight beams 6, 7 are incident forming the angles of incidence $\alpha_1$ and $\alpha_2$ respectively with the laser waveguide. The incident pumplaser beams are for reasons of simplicity denoted in the same way as in FIG. 1; the device according to FIG. 3 is general and illustrates the principles and of course is relevant also to the embodiment according to fig. 2. The pumpwavelength $\lambda_p$ is measured in the medium above the waveguide. In height the waveguide has the effective cross-section h. For the lasing wavelength $\lambda_L$ is given that $$\lambda_L = \lambda_P \frac{1}{\cos\frac{\alpha_1+\alpha_2}{2}} \cdot \frac{1}{\cos\frac{\alpha_1-\alpha_2}{2}}$$

Furthermore, preferably $$\left| \text{SIN}\left(\frac{\alpha_1-\alpha_2}{2}\right) \right| \cdot h \ll \frac{\lambda_L}{2}.$$

It is mostly an advantage if $\alpha_1$ and $\alpha_2$ are not identical since this prevents reflection back into the pumplaser. According to an advantageous embodiment the pumplight beams are equally strong, but it is also possible with an embodiment wherein the pumplight beams have different intensities. If a high intensity is wanted, the bottom of the waveguide is advantageously formed as totally reflecting for the pumplight. Furthermore it can be advantageous that the reflectivily is quite high at the surface so that substantially a so called Fabry-Perot-interferemeter is obtained heightwise. Then however the tuning range will be limited and it is a question of weighing if a higher tuning range is desired or if a particularly high intensity is wanted. This can be selected. Generally in FIGS. 1–3 the active layer is merely indicated and not illustrated as a particular layer of the waveguide. This should however be obvious.

Figure 4:
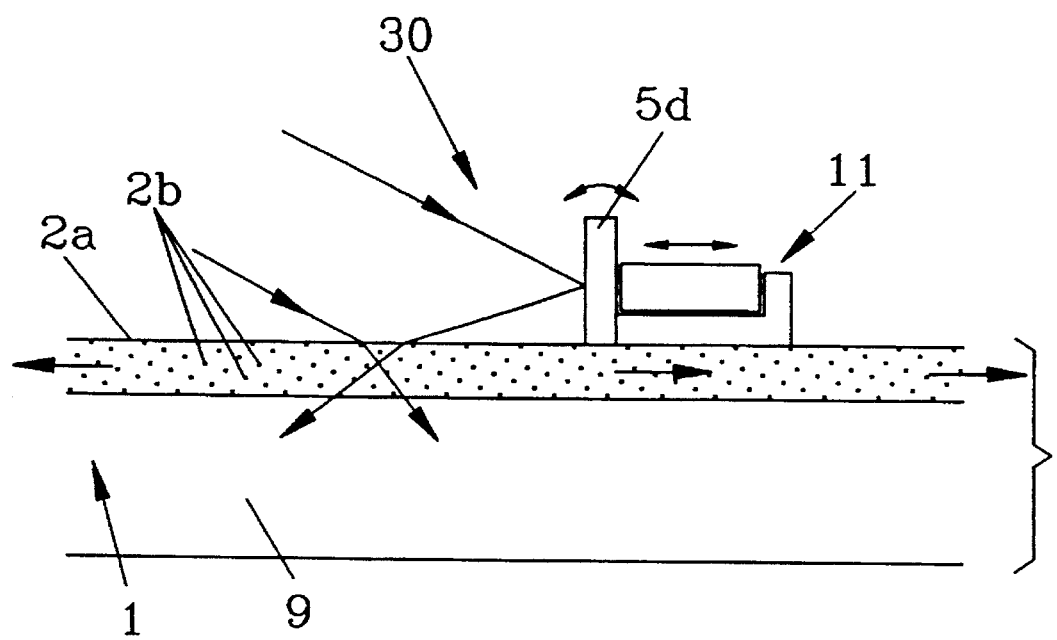
FIG. 4 illustrates very schematically a device wherein the active material comprises quantum wires or quantum dots.

FIG. 4 shows a device 30 wherein the active material 2a comprises quantum dots or quantum wires 2b. As already mentioned, to provide a grating through optical pumping of a semiconductor, charge carrier flow in the longitudinal direction must be substantially prevented. This can e.g. be achieved through splitting up the active layer or material in thin wires crossing the waveguide or in small dots with a diameter which can be about 10 nm (this numerical value is only given as an example).

Then also improved gain properties are obtained. For example the amplification band width can be increased and the variation in refractive index which is associated with the amplification can be reduced as compared to a homogenous active layer. It has also been difficult to produce quantum dots or quantum wires, but this is facilitated through the use of optical pumping, c.f. using e.g. electrical pumping charge carriers have to be injected into the wires/dots. Here the quantum wires or dots are provided in an active layer 2a arranged on a substrate 9 in the waveguide. The figure is schematical, merely indicating an active layer and a substrate. The position of the active layer and the substrate(s) as well as the widths of the layers can of course be chosen in the most appropriate way. Of course there may also be a spacer material on top of the active layer. The directing and orienting means 5d comprises a reflection device or a mirror which can be slightly rotated or displaced. The reflection means 5d is in this particular embodiment controlled by a piezo electric device 11 arranged on the substrate. The medium above the waveguide, can e.g. be air. In one embodiment the waveguide has a length of about 50–500 μm and the height of the mirror can be about 5–50 μm. These numerical values are however merely given as examples.

Figure 5:
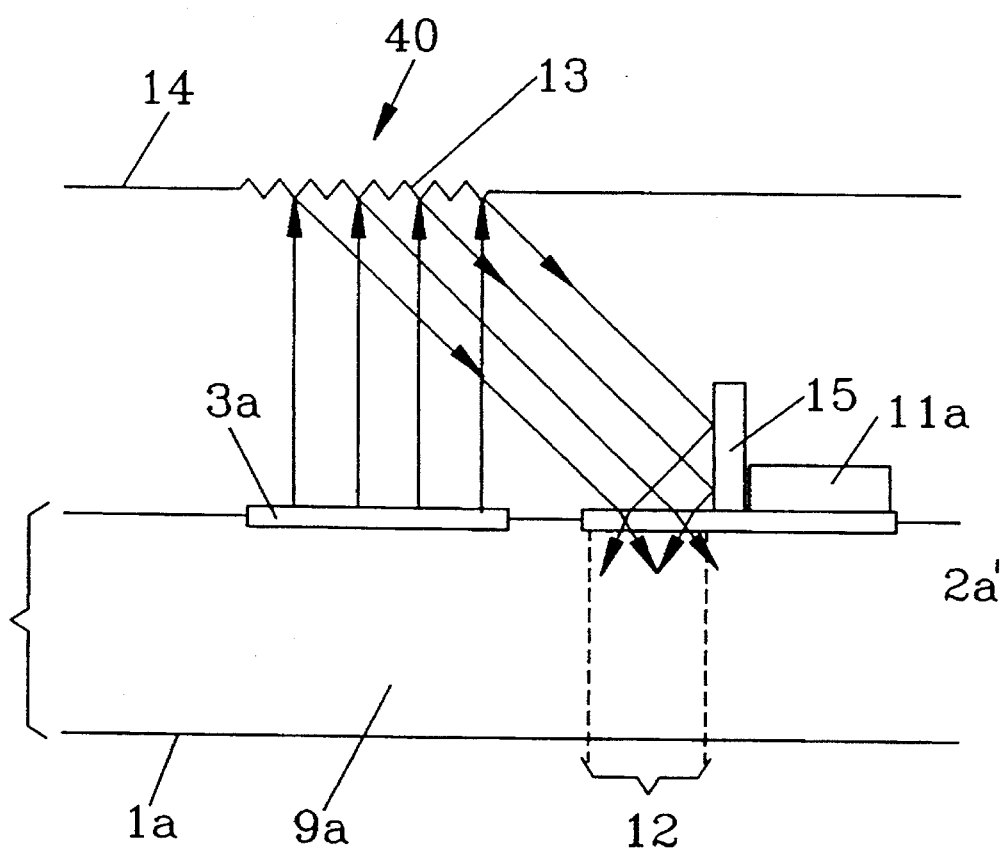
FIG. 5 illustrates an embodiment with a surface emitting laser providing pumplight beams and FIG. 6 illustrates schematically an alternative embodiment wherein the pumplight is introduced close to an outer end of the waveguide.

In the device 40 according to FIG. 5 the pump light is generated by a surface emitting laser 3a on the waveguide substrate 9a. The light is diffracted in a grating 13 in a glass plate 14 or similar arranged above and substantially parallell with the waveguide 1a. An optically pumped laser 12 is then obtained. The orienting and directing means comprises here the grating 13 of the plate 14 as well as a reflecting device or mirror 15 controlled by e.g. a piezo electric device or any other convenient arrangement 11a. The length of the surface emitting laser may e.g. be 0.1–1 mm although this is merely an example. The distance between the waveguide and the deflecting means or glass plate 14 may be 0.1–1 mm but this is also merely given as an example. This embodiments gives a very compact device. The active material may of course also here be in the form of quantum wires or quantum dots.

Figure 6:
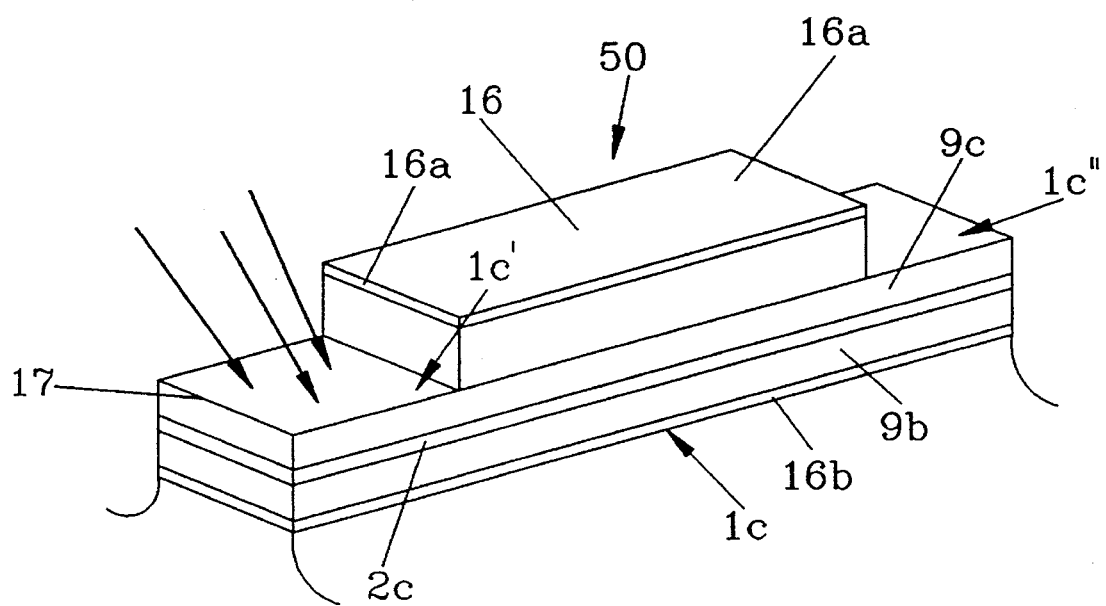

FIG. 6 relates to a device 50 wherein the pumplight is used in a particularly efficient manner through injection in one end portion 1c of the waveguide 1c. On top of the waveguide as well as at the bottom a reflecting device 16a, 16b is arranged. Reflecting means or layers are particularly also provided along the outer sides of the waveguide (not shown) in order to provide a confinement both heightwise and sideways.

This may of course have as a consequence that the tuning range gets reduced. As referred to in the foregoing it is a matter of choice if a high pump efficiency or if a wider tuning range is wanted.

On the top, the first outer end portion 1c" may be provided with an antiflective coating 17 or similar. The substrate(s) or the spacer layers 9b, 9c surround the active layer 2c.

According to one example of device 50 pumplight beams may also be injected at the second outer end portion 1c"'. According to a further example the second end portion 1c" may comprise a reflecting arrangement e.g. a mirror or similar which is somewhat rotatable and/or displaceable.

In both cases the reflecting device 16a, forms part of a dielectric reflecting arrangement 16. There are of course also a number of other possibilities. In other aspects the device according to FIG. 6 corresponds to the devices as already described. Therefore further details are omitted.

The invention is of course not limited to the shown embodiments but can be freely varied within the scope of the claims. Particularly the laser medium and the means for beam splitting, orienting and direction of pumplight beams which can be separate, i.e. means for beam splitting and means for orienting and directing or they may be formed by combined means having both the functions can be of many different kinds. Also a number of other alternatives are of course possible. The pumplaser can of course also be of many different kinds.

I claim:

1. A Tunable gain coupled laser device, particularly a DFB-laser, comprising a laser waveguide with an active material arranged therein, a pumplaser emitting pump-light with the pump-light wavelength $\lambda_p$ and means for orienting and directing pumplight beams towards the laser waveguide, wherein the active material is a semiconductor material in which charge carrier diffusion is prevented and which is excited by at least two pumplight beams originating from one and the same pumplaser and each forming an angle of incidence ($\alpha_1$, $\alpha_2$) with the laser waveguide.

2. A laser device as in claim 1, wherein the active material comprises quantum wires or quantum dots.

3. A device as in claim 1, wherein the pumpwavelength is variable or tunable so that the laser wavelength ($\lambda_L$) is varied through variation of the pumpwavelength ($\lambda_p$).

4. A device as in claim 3, wherein the pumplaser beam is pulsed.

5. A device as in claim 3, wherein the pumplaser beam is continous.

6. A device as in claim 3, wherein the means for orienting and directing are variable so that the laser wavelength ($\lambda_L$) can be varied through variation of the orienting means.

7. A device as in claim 6, wherein the orienting and directing means comprises a first and a second reflecting arrangement.

8. A device as in claim 7, wherein the first and the second reflecting arrangements comprise rotatable and/or displaceable mirrors.

9. A device as in claim 6, wherein the means for orienting and directing are common and comprises a mirror which is somewhat rotatable.

10. A device as in claim 6, wherein the means for orienting and directing further comprises beam splitting means.

11. A device as in claim 1, wherein the angle of incidence of the first beam, $\alpha_1$, is not the same as the angle of the incidence $\alpha_2$ of the second beam.

12. A device as in claims 1–11, wherein $\alpha_1$ and $\alpha_2$ are substantially but not identically the same.

13. A device as in claim 1, wherein no fixed reflection arrangements are provided.

14. A device as in claim 1, wherein the pumplaser beams are focused laterally.

15. A tunable gain coupled laser device comprising a laser waveguide comprising an active material, pump laser means emitting coherent pump light and means for orienting and directing beams from the pump laser means towards the waveguide, wherein the active material comprises an inverted population comprising a naturally freely moving carriers such as e.g. in a semiconductor and wherein the beams from the pumplaser means cross each other in the active material.

16. A device as in claim 15, wherein the active material is a semiconductor and wherein charge carrier diffusion is prevented.

17. A device as in claim 15, wherein the active material comprises quantum wires or quantum dots.

18. A device as in claim 15, wherein the at least two pump light beams originate from one and the same pump laser.

19. A device as to claim 18, wherein the pump laser is a surface emitting laser arranged on the substrate of the waveguide.

20. A device as claim 19, wherein the orienting and directing means comprises a grating.

21. A device as in claim 15, wherein the bottom layer of the waveguide is totally reflecting and wherein the device comprises a Fabry-Perot-interferometer in the transverse direction for the pumplight.

22. A device as in claim 15, wherein the waveguide comprises reflective means such as layers or similar arranged longitudinally along the waveguide on every outer side except for at least a first outer end portion wherein pumplight is incident through said outer end portion(s).

23. A device as in claim 22, wherein pumplight is incident through both the first and the second outer end portions.

24. A device as in claim 22, wherein said second outer end portion comprises a reflecting arrangement.

* * * * *